United States Patent
Dupis et al.

(10) Patent No.: US 9,088,260 B2
(45) Date of Patent: Jul. 21, 2015

(54) OPERATING PARAMETER CONTROL FOR A POWER AMPLIFIER

(75) Inventors: Francois Dupis, Pibrac (FR); Jacques Trichet, Cugnaux (FR)

(73) Assignee: Freescale Semiconductor, Inc., Austin, TX (US)

( * ) Notice: Subject to any disclaimer, the term of this patent is extended or adjusted under 35 U.S.C. 154(b) by 381 days.

(21) Appl. No.: 13/128,903

(22) PCT Filed: Dec. 3, 2008

(86) PCT No.: PCT/IB2008/055667
§ 371 (c)(1),
(2), (4) Date: May 12, 2011

(87) PCT Pub. No.: WO2010/064091
PCT Pub. Date: Jun. 10, 2010

(65) Prior Publication Data
US 2011/0221523 A1  Sep. 15, 2011

(51) Int. Cl.
*H01Q 11/12* (2006.01)
*H03G 3/30* (2006.01)

(52) U.S. Cl.
CPC .................................. *H03G 3/3047* (2013.01)

(58) Field of Classification Search
USPC ........ 455/127.2, 126; 375/297; 330/296, 136, 330/10
See application file for complete search history.

(56) References Cited

U.S. PATENT DOCUMENTS

| | | | |
|---|---|---|---|
| 5,748,038 A * | 5/1998 | Boscovic et al. | 330/2 |
| 6,831,517 B1 | 12/2004 | Hedberg et al. | |
| 7,046,087 B1 * | 5/2006 | Naik et al. | 330/136 |
| 7,193,459 B1 | 3/2007 | Epperson et al. | |
| 7,340,235 B1 | 3/2008 | Madsen et al. | |
| 2002/0109550 A1 * | 8/2002 | Dolman et al. | 330/284 |
| 2003/0155978 A1 * | 8/2003 | Pehlke | 330/296 |
| 2003/0201834 A1 * | 10/2003 | Pehlke | 330/296 |
| 2005/0227644 A1 | 10/2005 | Maslennikov et al. | |
| 2006/0066398 A1 | 3/2006 | Akamine et al. | |
| 2006/0084398 A1 | 4/2006 | Chmiel et al. | |
| 2006/0114062 A1 | 6/2006 | Joly | |
| 2007/0291872 A1 * | 12/2007 | Chan et al. | 375/297 |

FOREIGN PATENT DOCUMENTS

WO     03/105338 A    12/2003

OTHER PUBLICATIONS

International Search Report and Written Opinion correlating to PCT/IB2008/055667 dated Jul. 8, 2009.

* cited by examiner

*Primary Examiner* — Junpeng Chen

(57) ABSTRACT

A method of controlling operating parameters of a radio frequency power amplifier amplifying an input signal applied in bursts with controlled input power to an input of the power amplifier, comprising responding to gain variation parameters relating to variations in the scalar gain of said amplifier starting during an initial ramp-up period of a first burst to control supply voltage and quiescent current parameters for said amplifier during a subsequent burst.

21 Claims, 7 Drawing Sheets

OPERATING PARAMETER CONTROL FOR A POWER AMPLIFIER

FIELD OF THE INVENTION

This invention relates to operating parameter control for a power amplifier and more particularly to control of operating parameters of a radio frequency ('RF') amplifier. For the avoidance of doubt the expression 'radio frequency' is used herein to signify a frequency sufficient for telecommunication radio transmission, without implying any upper limit on the frequency.

BACKGROUND OF THE INVENTION

Techniques are known for controlling the output power of an RF power amplifier. A power detector, or the receiver path of a transceiver incorporating the power amplifier, can be used to measure the power of the signal from the amplifier output which is to be transmitted and the output power measurement can be applied over a feedback loop to a control circuit. The control circuit can compare the measured output power, and its variation in time, with a desired value defined by a reference signal and correct the output power.

It is known for the control circuit to control the gain of the power amplifier by controlling its operating conditions. Instead of using the feedback to control the output power by controlling the power amplifier gain, it is also known for the control circuit to control the power of the signal to be amplified supplied to the input of the power amplifier, known as input power control mode ('IPCM'), for example by controlling the amplitude of a signal from a voltage controlled oscillator and its modulation by the data to be transmitted.

Some widespread radio transmission standards, such as Global System for Mobile communications ('GSM'), General Packet Radio Service ('GPRS'), Enhanced Data rates for GSM Evolution ('EDGE'), for example, define the radio transmissions to be discontinuous and to occur in bursts. These standards contain tight specifications on the transmitted power, which is to be a function of command signals received, and also on the variation of the transmitted power during the burst, notably during the initial 'ramp-up' period of each burst. These specifications are more difficult to meet while also minimising the power consumption of the transmitter and notably of the power amplifier.

US Patent Specification US 2005l0227644 describes an envelope tracking RF power amplifier in which an RF input voltage is sampled by an adaptive envelope signal processing circuit which provides for constant power amplifier gain across the input signal dynamic range.

US Patent Specification 2006l0084398 describes an RF power amplifier which predictively determines a voltage value to continuously control a voltage converter for minimizing supply voltage or current drain of the power amplifier.

US Patent Specification 2006l0114062 describes a bias circuit for an RF linear power amplifier which includes a self-adaptable circuit that dynamically modifies the quiescent current for an output stage amplifier by automatically tracking an RF signal input to the amplifier at power ranges above a certain power output threshold.

SUMMARY OF THE INVENTION

The present invention provides a method of, and control apparatus for, controlling the power of an input signal applied in bursts to an input of a radio frequency power amplifier, amplifying apparatus including such a control apparatus and a transmitter apparatus including such amplifying apparatus, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
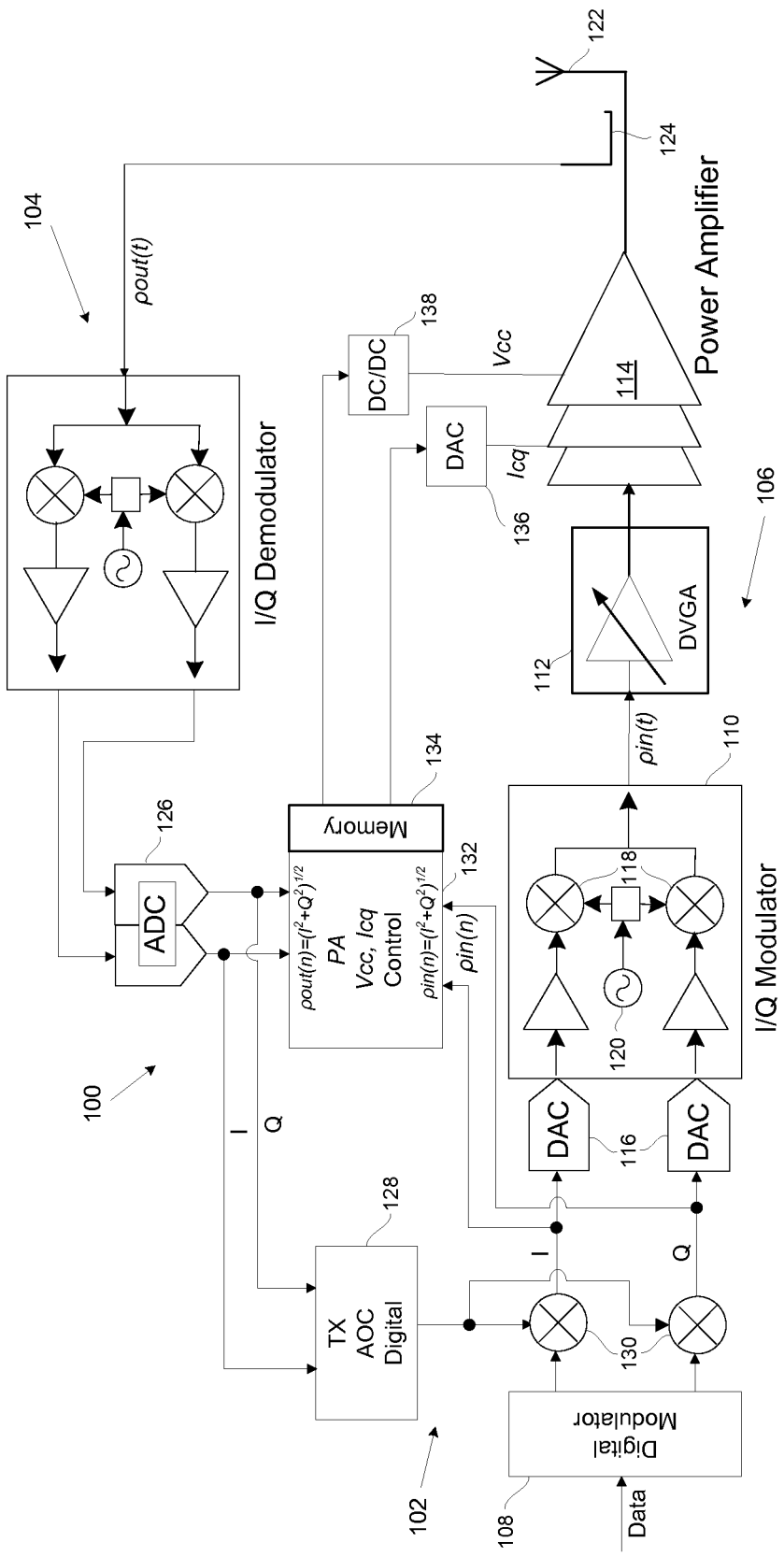
FIG. 1 is a schematic diagram of an example of a transmitter including a power amplifier and control apparatus for controlling operational parameters of the power amplifier in accordance with an embodiment of the invention, incorporated in a transceiver.

The transceiver 100 shown in FIG. 1 includes a transmitter module 102 and a receiver module 104. The transmitter module 102 functions in Input Power Control Mode ('IPCM') and comprises an IPCM source 106 of a complex RF signal having In-phase and Quadrature-phase ('I and Q') components, modulated on a carrier signal, to be amplified and transmitted, the source 106 including a digital transmit modulator 108, which converts input data to digital I and Q signals used to modulate the carrier signal in an I/Q modulator 110 and a digital variable gain amplifier ('DVGA') 112, that is to say an amplifier (or attenuator) whose gain is controlled by a digital control signal. The output signal from the DVGA 112 is supplied as input to an RF power amplifier 114 and has a power level that is controlled to give a desired instantaneous output power level from the power amplifier 114.

The I and Q digital signals from the digital modulator 108 are applied to digital-to-analogue converters ('DAC') 116 and the corresponding analogue signals from the DACs 116, of modulus pin(t), are supplied to mixers 118 in the I/Q modulator 110, which apply the analogue data signals to modulate an RF carrier in phase and amplitude. The modulated signal is applied to the DVGA 112, whose output is applied to the input of the RF power amplifier 114. The IPCM source 106 generates the input signal in bursts with controlled input power and adjusts the instantaneous signal amplitude to meet the ramp-up, ramp-down and/or other specifications for the signal to be transmitted. The nominal gain of the power amplifier 114 is set by the initial quiescent currents applied to each stage of the power amplifier. The amplified output signal from the power amplifier 114 is applied to an antenna 122 for transmission.

A feedback loop for the power amplifier 114 includes a power coupler 124 which senses the signal applied to the antenna 122. In this embodiment of the invention, the signal sensed by the coupler 124 is applied to the receiver 104, which is used to down convert and sample the output signal from the power amplifier. As shown in FIG. 1, the analogue line-up of the receiver 104 is of the zero intermediate frequency ('IF') type, but it is also possible to use a very low IF line-up of the receiver 104, for example, while benefiting from simplified circuit configurations because perfect synchronization of the local oscillator is not required for measuring the scalar gain of the power amplifier 114. The analogue I and Q signals from the receiver 104 are sampled and converted to digital signals in an analogue-to-digital converter ('ADC') 126 and used in a transmit automatic output control ('TX AOC') digital module 128 to multiply the I/Q signals from the Digital modulator 108 in multipliers 130 by a suitable amplitude scaling coefficient a so as to correct the modulation level and generates a command signal, which is applied to the DVGA 112 to correct the amplitude of the signal applied to the power amplifier 114.

The demodulated I/Q feedback signals from the ADCs 126 are compared in a power amplifier control module 132 with the input I/Q signals from the multipliers 130 and the deviation, stored in a memory 134 in the control block 132, is used to control a quiescent current Icq and supply voltage Vcc of the power amplifier 114.

The control module 132 responds to gain variation parameters relating to variations in the scalar gain of the power amplifier 114 starting during a first burst to control supply voltage Vcc and quiescent current kg parameters for the power amplifier 114 during a subsequent burst. In the example shown in FIG. 1, the control module 132 receives pin(n) $(=\sqrt{(Iin^2+Qin^2)})$ representing the modulus of the input signals from the IPCM source 106 and pout(n) $(=\sqrt{(Iout^2+Qout^2)})$ representing the modulus of the output signal of the power amplifier 114 applied to the antenna 122 from the ADC 126 and calculates the instantaneous scalar gain: pout(n)/pin(n). If necessary, the numeric data flows representing pin(n) and pout(n) are time aligned in order to compensate for any systematic delay of the transmitter line-up (signal generation) and the receiver line-up (measurement path). This time-alignment, if needed at all, is generally quite predictable and constant and so does not need to be calibrated.

The control module 132 allows the settings of the RF Power Amplifier to be modified dynamically, from one burst to the next burst, in order to optimise the performances of the transmit chain. This dynamic control of the operating parameters, in particular its supply voltage Vcc and quiescent current Icq, enables current consumption to be controlled over the whole output power range and the size of the power amplifier 114 to be optimised. The control module 132 computes the gain curve starting during one transmit burst, extracts some key parameters (Gain Expansion, Gain Compression) and defines settings for the RF Power Amplifier for the next transmit burst. Computed parameters are stored in the dedicated memory 134 of the transceiver and updated dynamically on a burst to burst basis. More specifically, the control module 132 provides a signal which is applied to a DAC 136 to adjust the quiescent currents Icq of the RF power amplifier 114 for the next coming burst. The control module 132 also provides a signal which varies the DC supply voltage Vcc applied to the RF Power Amplifier by a DC-DC converter 138. The combination of input power control with power amplifier operating parameter control allows the overall efficiency of the RF transmit chain to be controlled in an adaptive manner under varying conditions such as battery voltage, temperature, frequency range and output power range.

Figure 2:
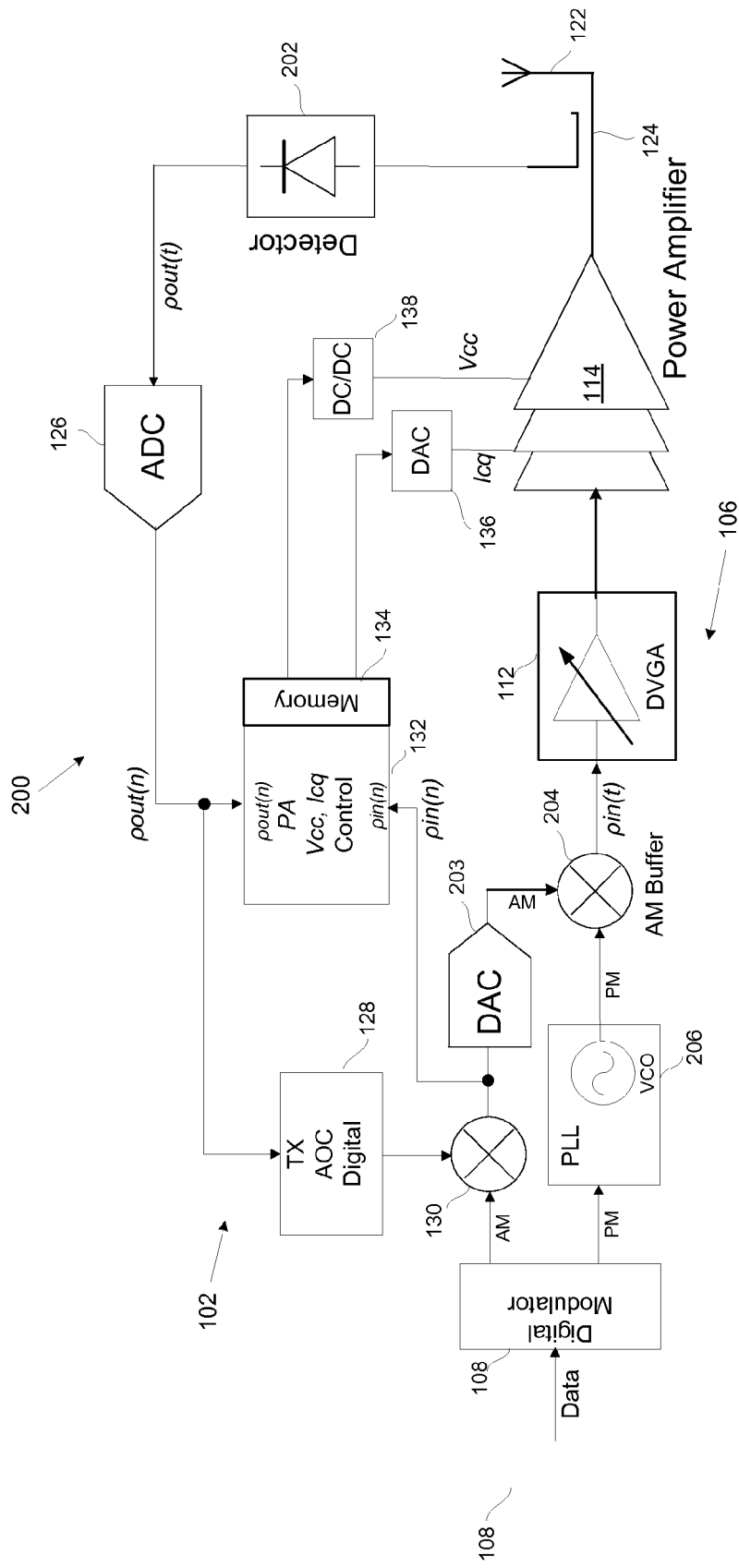
FIG. 2 is a schematic diagram of another example of a transmitter including a power amplifier and control apparatus for controlling operational parameters of the power amplifier in accordance with an embodiment of the invention, incorporated in a transceiver.

FIG. 2 shows a transceiver 200 having similar elements to the transceiver 100 shown in FIG. 1, which bear the same references. However, for the purposes of the feedback loop, instead of using the receiver module 104, the transceiver 200 has a detector 202, which reproduces the output signal envelope of the power amplifier 114 directly at the output detector of the detector 202, with a dynamic range slightly less than the feedback loop in the transceiver of FIG. 1 but sufficient for controlling the power amplifier operating parameters. Also, in the example of FIG. 2, the digital modulator module 108 provides an amplitude modulation signal component, applied to a single multiplier 130, which multiplies it by the signal from the TX AOC digital module 128, to provide pin(n) to control module 132 and to a DAC 203, which provides a corresponding analogue amplitude modulation signal component to a multiplier 204. The multiplier 204 receives a carrier signal from a source 206 which comprises a voltage controlled oscillator with a phase-locked-loop phase modulator for phase-modulating the carrier signal according to a phase modulation signal component from the digital modulator module 108 and provides the analogue signal pin(t) to the DVGA 112.

Figure 3:
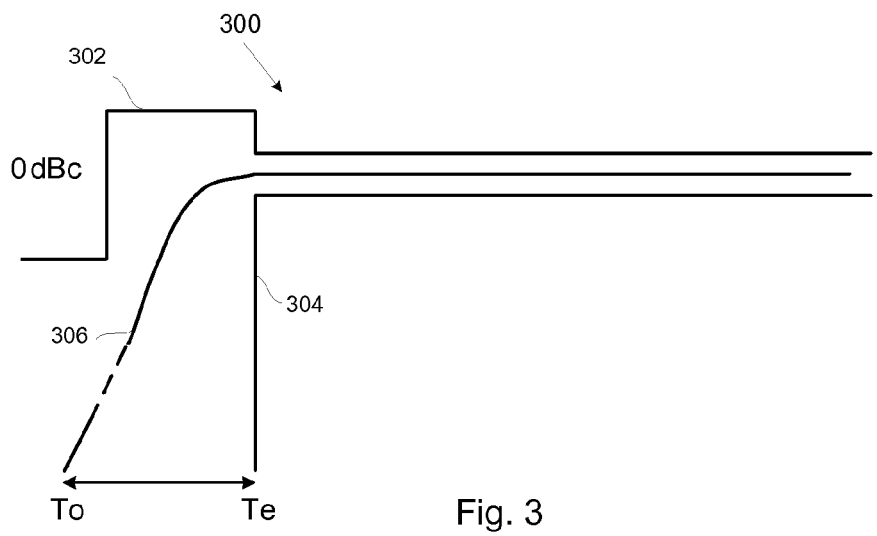
FIG. 3 is a graph of the variation with time of a signal compared to the amplitude modulation envelope limits in conformity with a GMSK specification during an initial ramp-up period of a signal burst.

FIG. 3 illustrates a specification 300 for permissible variation with time during a ramp-up period between time To and time Te and a subsequent constant envelope data flow period for a Gaussian Minimum-Shift Keying ('GMSK') transmission specification, the limits being defined by straight lines 302 and 304 and a signal that is in compliance with the specification being illustrated by a curve 306.

Figure 4:
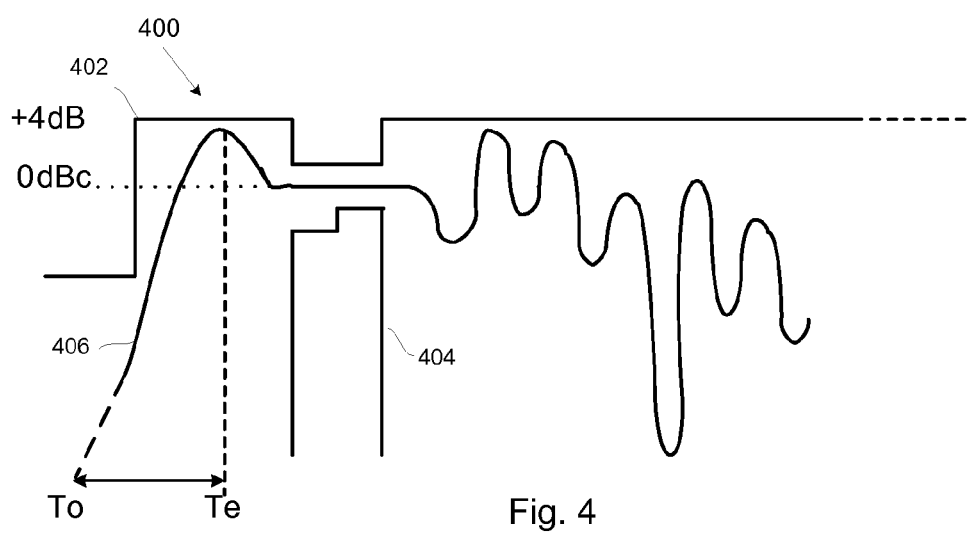
FIG. 4 is a graph of the variation with time of a signal compared to the amplitude modulation envelope limits in conformity with an EDGE specification during an initial ramp-up period of a signal burst.
Figure 5:
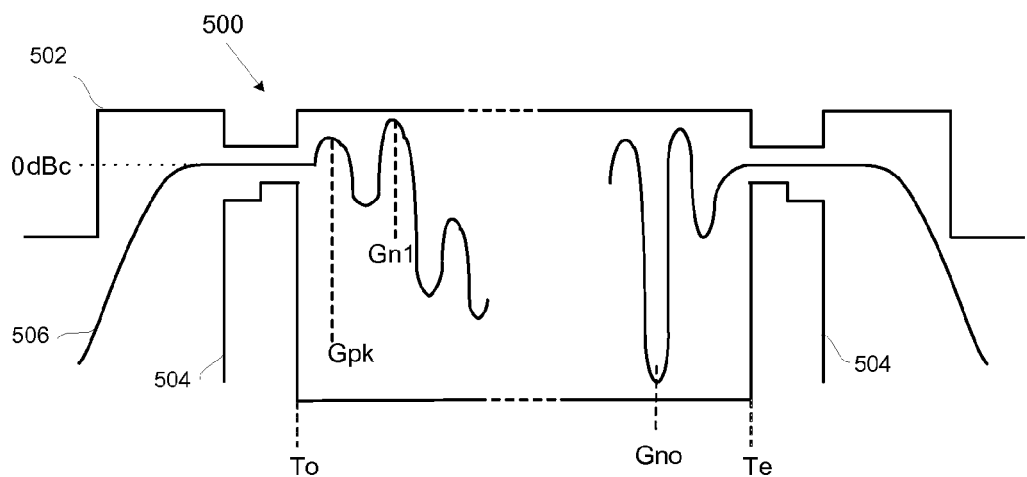
FIG. 5 is a graph of the variation with time of a signal compared to the amplitude modulation envelope limits in conformity with an EDGE specification during a data sequence of a signal burst.

FIGS. 4 and 5 show two situations that can occur with 8-Phase-Shift Keying ('8-PSK') such as found in the EDGE standard. In the situation illustrated in FIG. 4, the specification 400 is defined by straight lines 402 and 404 and a signal that is in compliance with the specification being illustrated by a curve 406, enabling gain variation for the control of the power amplifier parameters to be measured during the ramp-up period between time To and time Te. The permissible envelope during the subsequent data flow period is not constant. In the situation illustrated in FIG. 5, the specification 500 is defined by straight lines 502 and 504 and a signal that is in compliance with the specification is illustrated by a curve 506, measurement of the gain variation for the control of the power amplifier parameters starts after the ramp-up period at the beginning of the data transmission period at time To but continues during the data flow period until time Te at the end of the data transmission period.

Figure 6:
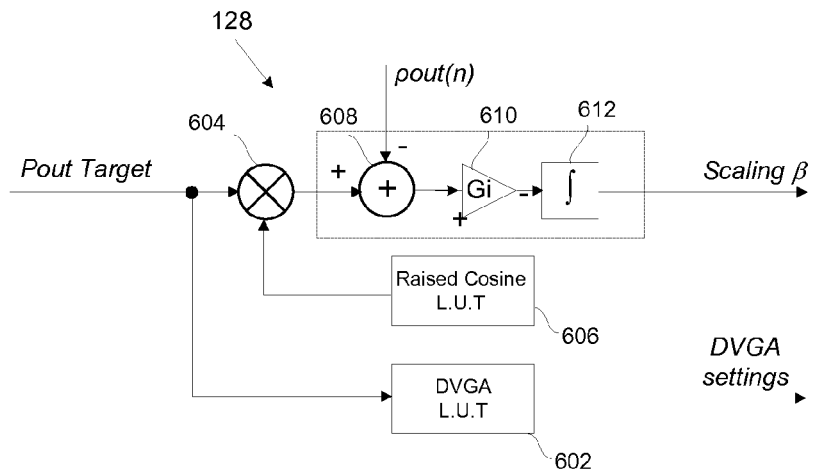
FIG. 6 is a schematic diagram of an example of a transmit automatic output control module in the transmitter apparatus of FIG. 2.

FIG. 6 shows an example of implementation of the transmit automatic output control ('TX AOC') digital module 128 in this embodiment of the invention. A digital reference signal Pout_Target representing the expected Output Power during the transmitted slot is provided as the input of the Tx AOC loop. This parameter is usually derived from Phone calibration procedure and stored in ad hoc Memory (not shown). It defines the desired output power for the power amplifier 114 depending on the exact operating conditions prescribed by the network (allocated Channel Frequency, requested Up-link Power) The reference signal Pout_Target is also applied to a look-up table 602 which generates DVGA setting signals as a function of the characteristics of the DVGA 112 and which control the gain of the DVGA. The purpose of this DVGA is to extend the dynamic range of the transmit line-up on top of the digital gain control available at base band level. The signal Pout_Target is also applied to one input of a multiplier 604, to the other input of which is applied a signal from a normalized raised cosine look-up table 606. The normalized raised-cosine look-up table ensures accurate and smooth shaping of the Power during ramp-up and ramp-down phases of the Transmitted signal in order to minimize the induced spectral splatter. The output of the multiplier 604 is compared in a comparator 608 with the signal pout(n) representing the modulus of the output signal of the power amplifier 114 and the difference is amplified in an amplifier 610 and integrated in an integrator 612 to provide a scaling factor signal of value alpha which is applied to the multiplier 130.

The nominal initial gain of the power amplifier 114 is constant for very low amplitudes of the RF input signal and is set by the initial quiescent currents applied to each stages of the RF Power amplifier. However, the power amplifier 114 is operated in class AB mode. Accordingly, a greater quiescent current Icq in the input bias circuit provides an initial operating point closer to class A operation than does a smaller quiescent current, with less distortion of small amplitude signals. A greater supply voltage Vcc provides more headroom for accommodating large signals than a smaller supply voltage, meaning that the power amplifier saturates only at larger amplitude signals. A reduction in the power consumption of the power amplifier can be obtained if it is run with lower quiescent current Icq and supply voltage Vcc, limits being set by the increased levels of distortion of the power amplifier output signal that are permissible.

Figure 7:
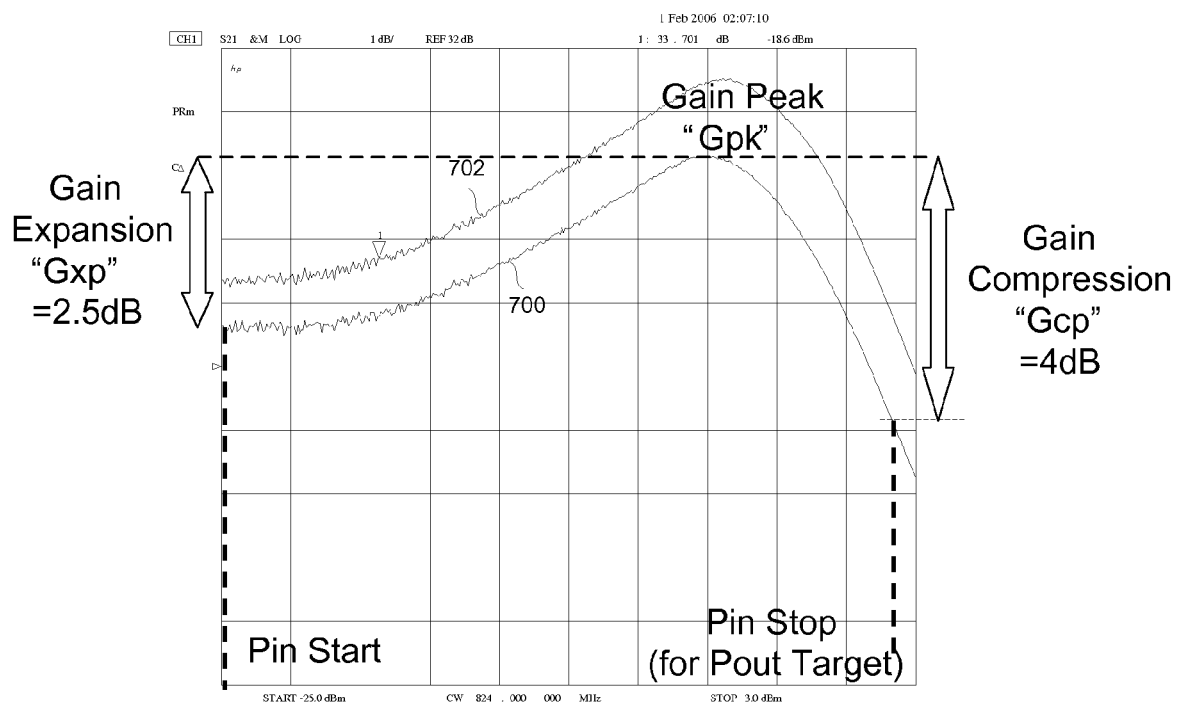
FIG. 7 is a graph of the variation with input power of the scalar gain of the power amplifier in the transmitters of FIG. 1 and FIG. 2 starting at the initial ramp-up of a signal burst in conformity with a GMSK specification during an initial ramp-up period of a signal burst.

In a class AB power amplifier such as 114, whether in bipolar transistor or field-effect transistor technology, the instantaneous gain of the power amplifier varies as a function of the instantaneous input power level and supply voltage Vcc. In particular, as shown in FIG. 7, where the vertical axis represents the instantaneous gain of the power amplifier 114 during a burst against the input amplitude as horizontal axis for a GMSK transmission, due to the self-biasing effect an increasing amplitude of the input signal causes the gain of the power amplifier to increase from an initial gain G(Pin_start) to a peak gain Gpk. However, as the input amplitude continues to increase, the power amplifier 114 tends to saturate if it encounters limited voltage headroom and the gain of the power amplifier reduces to an ultimate value G(Pin_stop), at the end of the input signal phase or at a point in time where the output power has reached its target value. In one example of implementation, the initial value of the input signal amplitude is −25 dBm and rises to an ultimate value of +3 dBm.

The curve 700 of FIG. 7 shows an example of operation in which the gain expansion Gxp of the power amplifier 114 from the initial gain G(Pin_start) to the peak gain Gpk is 2.5 dB and the gain compression Gcp from the peak gain Gpk to the ultimate value G(Pin_stop) is 4 dB for a supply voltage of 3.6V, and the curve 702 of FIG. 7 shows another example of operation for a supply voltage of 4.5V. The absolute values of the instantaneous gain are complex functions of more than one parameter but the gain expansion Gxp is correlated with the quiescent current Icq whereas the gain compression Gcp is correlated with the supply voltage Vcc.

In this example of an embodiment of the present invention, the quiescent current Icq of the power amplifier 114 for a burst is set to a value as low as is consistent with permissible distortion limits, as a function of the gain expansion Gxp in the previous burst and the supply voltage Vcc of the power amplifier 114 for a burst, and is set to a value as low as is consistent with permissible distortion limits as a function of the gain compression Gcp. More specifically, in one example of an embodiment of the invention, the dedicated memory of the control module 132, stores the values of the gain expansion Gxp and the gain compression Gcp calculated during one burst and, before the next burst, calculates the values of Icq and Vcc which are applied to the DAC 136 and the DC/DC converter 138 during the next burst. In another example of an embodiment of the invention, the dedicated memory 134 stores the values of Icq and Vcc calculated during one burst and applies them to the DAC 136 and the DC/DC converter 138 during the next burst. In one example of an embodiment of the present invention, the dedicated memory 134 stores the values calculated only from one burst to the next. However in another example of an embodiment of the invention, the dedicated memory 134 stores a rolling average of the values calculated, which is used to set Icq and Vcc.

Figure 8:
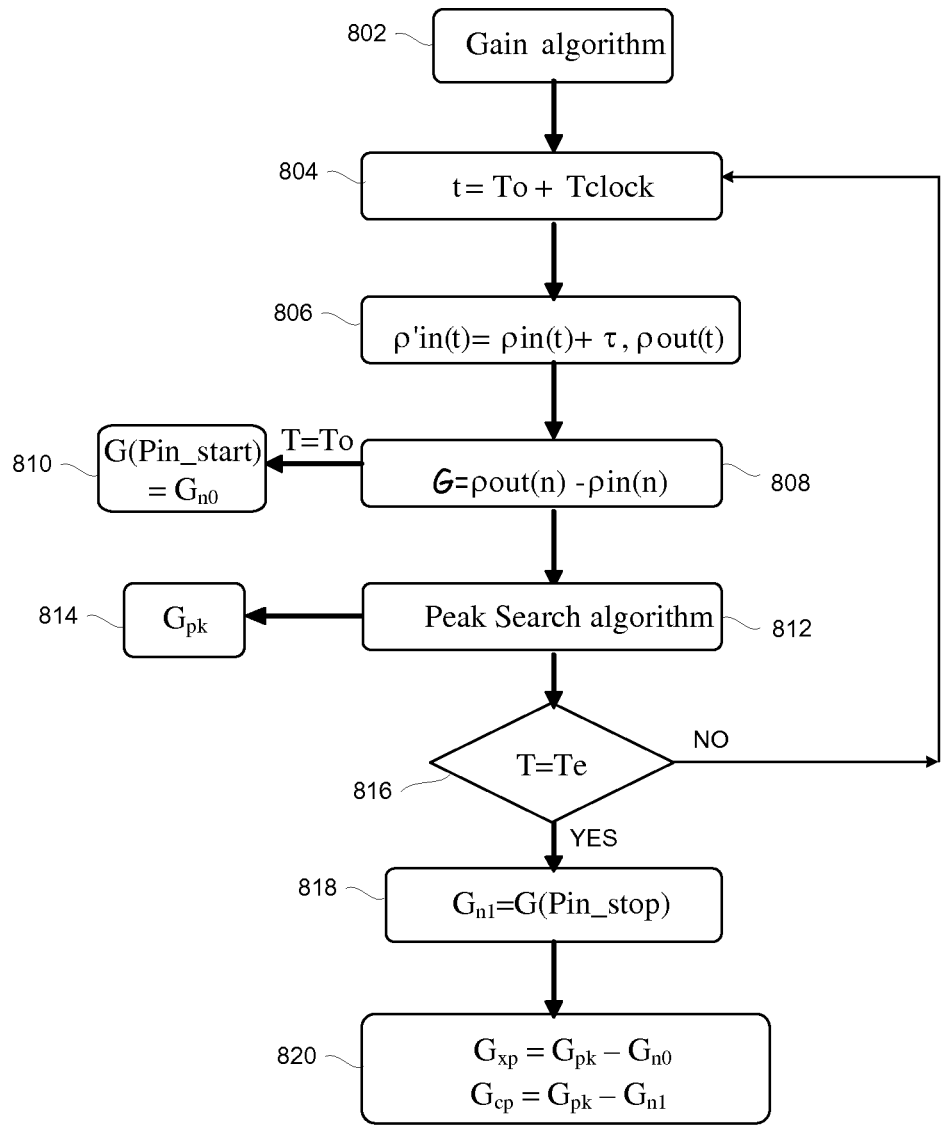
FIG. 8 is a flow chart of a method of determining gain variation parameters relating to variations in the scalar gain of said amplifier starting during an initial ramp-up period of a burst.

FIG. 8 is a flow chart of a method 800 of determining the gain expansion Gxp and the gain compression Gcp in one example of an embodiment of the present invention. The calculation algorithm starts at 802 at a moment To, during an initial ramp-up period of a burst, at or close to the start of the ramp-up. At 804, a clock is started to time the sampling periods by increments from the start To. At 806, the control module 132 updates the value it registers of the analogue input signal of modulus pin(t) for the power amplifier 114 from the DAC 108 and samples the measured output modulus pout(t) from the detector 202 (in the case of FIG. 2) or the receiver 104 (in the case of FIG. 1). At 808, the control module 132 calculates the instantaneous scalar gain G=pout(n)/pin(n) of the power amplifier 114. At 810, if the clock time corresponds to To, the control module 132 registers the value $G_{n0}$ which equals G(Pin_start) of the gain G for the start moment To in the case of the specifications of FIGS. 3 and 4, for example. At 812, the control module 132 searches for a peak in value of the gain G and at 814 registers the peak value Gpk, when found. At 816, a decision is made whether the clock time corresponds to the maximum, or end time Te for the algorithm for this burst and if not the algorithm returns to the step 804 which updates the sample period. If the time corresponds to Te, however, the algorithm registers the value $G_{n1}$ which equals G(Pin_stop) of the gain G for the end moment Te in the case of the specifications of FIGS. 3 and 4. The algorithm then performs at 820 the calculations of gain expansion Gxp=Gpk−G(Pin_start) and gain compression Gcp=Gpk−G(Pin_stop.), either immediately or just before the next burst. For an EDGE modulation scheme, To and Te can be set in two different ways. In the first case, as shown in FIG. 4, To is set close to the start of the ramping. Te is set when the amplitude of the ramping signal reaches its maximum value computed by adding in the burst an amplitude pulse extension equal to the maximum peak average ratio of 3.2 dB of the 8PSK modulation. In the second case, as shown in FIG. 5, To is set at the beginning of the data flow and Te at the end of the data flow. In this case, the instantaneous amplitude of the envelope is sampled at Tclock to determine Gn0, Gpk and Gn1 and in the same manner compute Gxp and Gcp. Gno is the gain value obtained when the input power level reaches its minimum value during the data flow window [To, Te]. Gn0 is similar to the small-signal gain Gn0 obtained at To in the case of the FIG. 3 or FIG. 4. Gn1 is the gain value obtained for the maximum level of input power which occurs during the data flow window [To,Te]. It is similar to the gain Gn1 obtained at Te (end of the ramping when the input power is maximum) in the case of FIG. 3 or FIG. 4.

Figure 9:
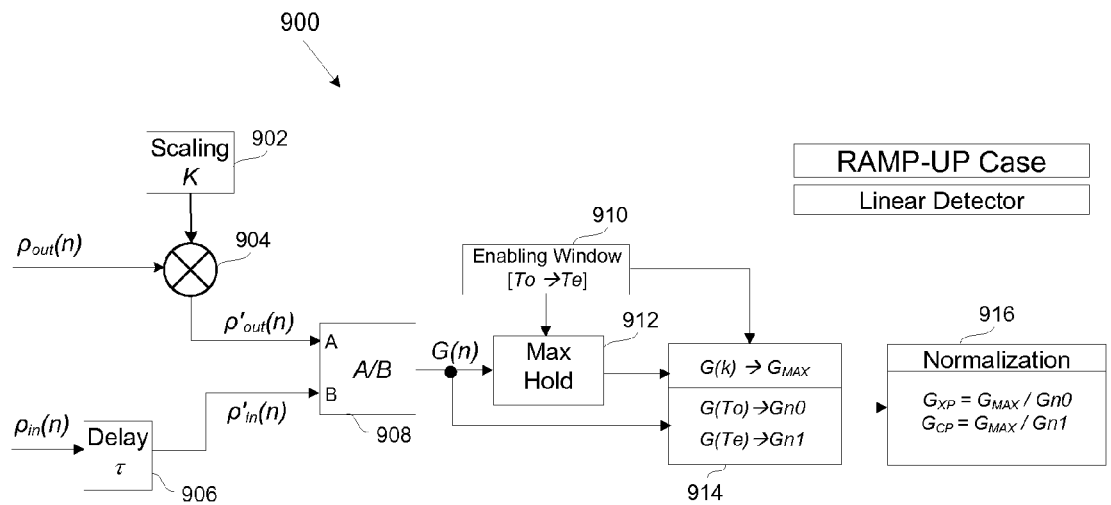
FIGS. 9 to 11 are block diagrams of a part of a power amplifier control module in examples of implementations of the transmitters of FIGS. 1 and 2 for different usage cases.

FIGS. 9 to 12 show more detailed examples of implementations of the control module 132 for different embodiments of the invention. FIG. 9 shows a part 900 of the module 132 that produces signals representing the gain expansion Gxp and the gain compression Gcp for use where the specification defines the variation of the power transmitted levels during the ramp-up period, as illustrated by FIGS. 3 and 4, for example, in the case as in FIG. 1 where the feedback signal applied to the control module by the ADC 126 is a linear function of the transmitted power. The element 900 receives the output and input modulus signals pout(n) and pin(n). A simple and static scaling factor K is generated by a scaling element 902 and applied to one of the modulus signals by a multiplier 904 to bring the signals from the input path and the feedback path to roughly same scale in order to maximize the dynamic range within module 900. The purpose of the optional scaling block is to optimize the computational accuracy within the digital processing chain. A time delay is applied to one of the modulus signals by a delay element 906, to synchronise the signals from the input and feedback paths. The adjusted signals p'out(n) and p'in(n) from the multiplier 904 and delay element 906 are then divided in a divider 908 to produce a signal G(n) representing the instantaneous gain of the power amplifier 114. A timer 910 defines an enabling time window for calculation of the gain parameters. A maximum hold element 912 produces and holds a signal Gpk representing the peak value of the gain during the enabling time window. A register 914 registers the signal Gpk and the values G(Pin_start) and G(Pin_stop) of the gain signal G(n) at the beginning and end of the enabling window, time To and time Te. A divider 916 then produces signals representing normalised values Gpk/G(Pin_start) and Gpk/G(Pin_stop) of the gain expansion Gxp and gain compression Gcp.

Figure 10:
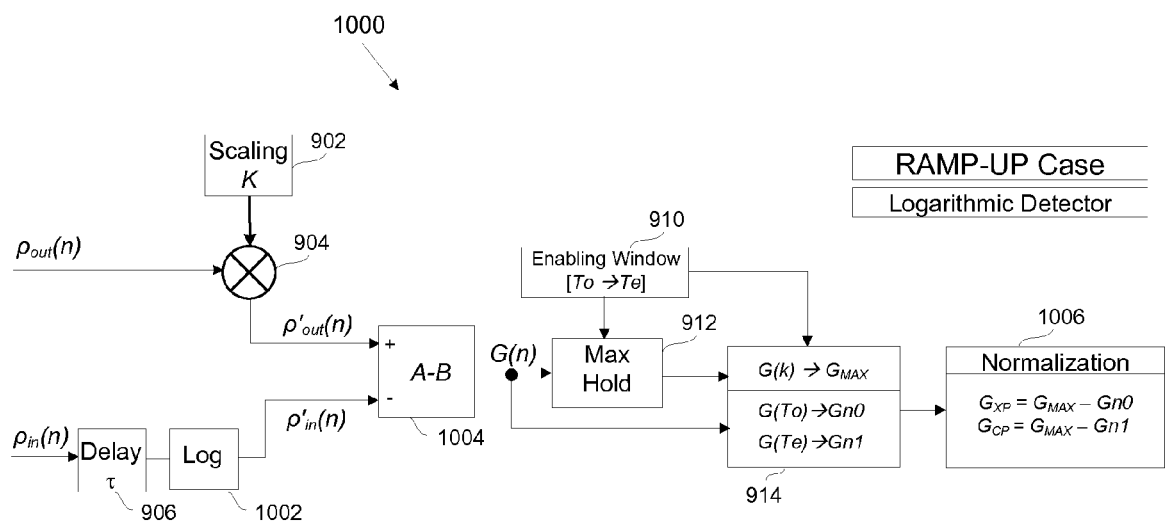

FIG. 10 shows a part 1000 of the module 132, similar to part 900 shown in FIG. 9 that produces signals representing the gain expansion Gxp and the gain compression Gcp for similar use but where the feedback signal applied to the control module by the ADC 126 is a logarithmic function of the transmitted power. The part 1000 comprises similar elements to the part 900, except that the divider 908 is replaced by a subtractor which produces the difference p'out(n)−p'in(n) of the adjusted signals in logarithmic base from the multiplier 904 and delay element 906, and that the divider 916 is replaced by a subtractor which produces the difference signals Gpk−G(Pin_start) and Gpk−G(Pin_stop) representing normalised values of the gain expansion Gxp and gain compression Gcp in logarithmic base.

Figure 11:
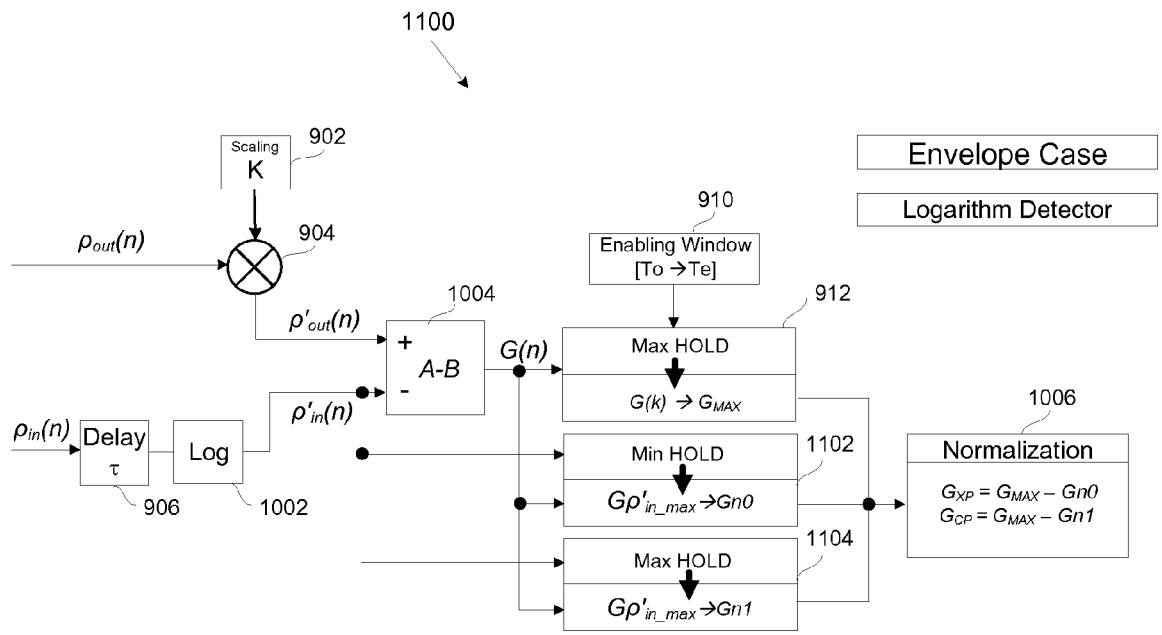

FIG. 11 shows a part 1100 of the module 132, similar to part 1000 shown in FIG. 10 that produces signals representing the gain expansion Gxp and the gain compression Gcp where the feedback signal applied to the control module by the ADC 126 is a logarithmic function of the transmitted power but for use where the specification defines the variation of the power transmitted levels during the data transmission period, as illustrated by FIG. 5. The part 1100 comprises similar elements to the part 1000, except that the register 914 is replaced by maximum hold elements 1102 and 1104 that produce and hold signals G(Pin_start) and G(Pin_stop) representing the value of the gain G(n) at moments during the enabling time window when the adjusted input signal modulus p'in(n) is minimum and maximum respectively, to produce signals representing the values G(Pin_start) and G(Pin_stop) as well as the signal Gpk. It will be appreciated that the part 1100 can be adated to the case of a linear power detection by replacing the subtractor elements 1002 and 1004 by divider elements 908 and 916.

Figure 12:
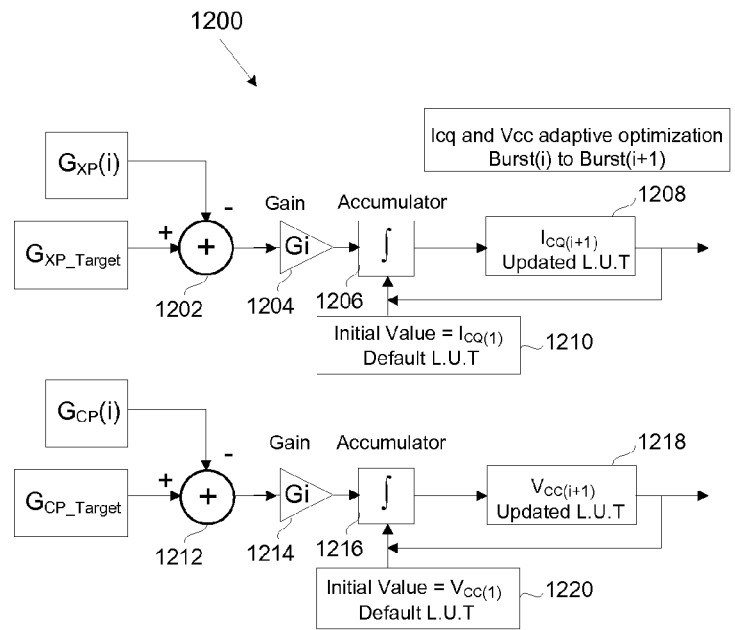
FIG. 12 is a block diagram of another part of a power amplifier control module in an example of implementation of the transmitters of FIGS. 1 and 2.

FIG. 12 shows a part 1200 of the module 132 that produces signals representing the quiescent current Icq and supply voltage Vcc as a function of the gain expansion Gxp and the gain compression Gcp signals from the parts 900, 1000 or 1100 and applies the signals to the DAC 136 and DC/DC converter 138. A subtractor 1202 receives the gain expansion signal Gxp(i) from the parts 900, 1000 or 1100 and a predefined target gain expansion signal Gxp_target which is stored in a look-up table, for example, and depends on modulation type and power levels. The subtractor 1202 produces a time-sampled difference signal representing the deviation of the actual signal from the target, and which is amplified in an amplifier 1204. An accumulator 1206 receives the difference signal during the current burst (i) and updates a look-up table 1208 holding the value Icq(i) to the value Icq(i+1) for the next burst (i+1). At the first transmission when the transmitter is switched on, a default look-up table 1210 provides the value Icq(1) during the first burst. Similarly a subtractor 1212 receives the gain compression signal Gcp(i) from the parts 900, 1000 or 1100 and a predefined target gain compression signal Gcp target which is stored in a look-up table, for example, and depends on modulation type and power levels. The subtractor 1212 produces a time-sampled difference signal representing the deviation of the actual signal from the target, and which is amplified in an amplifier 1214. An accumulator 1216 receives the difference signal during the current burst (i) and updates a look-up table 1218 holding the value Vcc(i) to the value Vcc(i+1) for the next burst (i+1). At the first transmission when the transmitter is switched on, a default look-up table 1220 provides the value Vcc(1) during the first burst.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

The invention may be implemented at least partially using a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-ROM or diskette, stored with data loadable in a memory of a computer system, the data representing the computer program. The data carrier may further be a data connection, such as a telephone cable or a wireless connection.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details are not explained to any greater extent than that necessary for the understanding and appreciation of the underlying concepts of the present invention, in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although an exemplary information processing architecture is described, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements are circuitry located on a single integrated circuit or within a same device. Alternatively, the system may include a number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be elements received, for example, from computer readable media such as memory or other media on other computer systems. Such computer readable media may be permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A method comprising:
controlling operating parameters of a radio frequency power amplifier amplifying an input signal applied in bursts with controlled input power to an input of the power amplifier; and
responding to gain variation parameters relating to variations in a scalar gain of said amplifier starting during a first burst to control supply voltage and quiescent current parameters of said amplifier for a subsequent burst, wherein the gain variation parameters inc de a difference between a starting gain of the am lifter at a start of the initial ramp-up period and a peak gain of the amplifier during the initial ramp-up period of the first burst.

2. A method as claimed in claim 1, wherein said gain variation parameters relate to at least the initial ramp-up period of said first burst.

3. A method as claimed in claim 1 wherein said gain variation parameters include a difference between a peak gain of said amplifier during said first burst and a subsequent gain of said amplifier later during said first burst.

4. A method as claimed in claim 3, wherein controlling said supply voltage for said power amplifier includes responding to said difference between said peak gain and said subsequent gain.

5. A method as claimed in claim 1, further comprising:
storing said gain variation parameters until said subsequent burst.

6. A method as claimed in claim 1, further comprising:
storing values of said supply voltage and quiescent current parameters until said subsequent burst.

7. A method as claimed in claim 1 wherein said scalar gain comprises a calculated ratio between a modulus of a detected power output of said power amplifier relative to a modulus of an input power for said power amplifier.

8. A method comprising:
controlling operating parameters of a radio frequency power amplifier amplifying an input signal applied in bursts with controlled input power to an input of the power amplifier; and
responding to gain variation parameters relating to variations in a scalar gain of said amplifier starting during a first burst to control supply voltage and quiescent current parameters of said amplifier for a subsequent burst, wherein said gain variation parameters relate to at least an initial ramp-up period of said first burst, and wherein said gain variation parameters include a difference between a starting gain of said amplifier at a start of said initial ramp-up period and a peak gain of said amplifier during said initial ramp-up period of the first burst.

9. A method as claimed in claim 8, wherein controlling said quiescent current for said power amplifier includes responding to said difference between said starting gain and said peak gain.

10. The method of claim 8, further comprising:
storing said gain variation parameters until said subsequent burst.

11. The method of claim 8, further comprising:
storing values of said supply voltage and quiescent current parameters until said subsequent burst.

12. The method of claim 8, wherein said scalar gain comprises a calculated ratio between a modulus of a detected power output of said power amplifier relative to a modulus of an input power for said power amplifier.

13. Control apparatus to control operating parameters of a radio frequency power amplifier to amplify an input signal applied in bursts with controlled input power to an input of the power amplifier, the control apparatus comprising:
a control module for responding to gain variation parameters relating to a variation in a scalar gain of said amplifier starting during a first burst in controlling supply voltage and quiescent current parameters of said amplifier for a subsequent burst, wherein said gain variation parameters relate to at least an initial ramp-up period of said first burst, and wherein said gain variation parameters include a difference between a starting gain of said amplifier at a start of said initial ramp-up period of said amplifier during said initial ramp-up period of the first burst.

14. Control apparatus as claimed in claim 13, wherein the control module controls said quiescent current parameter for said power amplifier in response to said difference between said starting gain and said peak gain.

15. Control apparatus as claimed in claim 13, wherein said gain variation parameters include a difference between a peak gain of said amplifier during said first burst and a subsequent gain of said amplifier later during said first burst.

16. Control apparatus as claimed in claim 15, wherein the control module controls said supply voltage parameter for said power amplifier in response to said difference between said peak gain and said subsequent gain.

17. Control apparatus as claimed in claim 13, wherein said control module includes a store to store said gain variation parameters until said subsequent burst.

18. Control apparatus as claimed in claim 13, wherein said control module includes a store to store values of said supply voltage and quiescent current parameters until said subsequent burst.

19. Control apparatus as claimed in claim 13, wherein said control module is responsive to a calculated ratio between a modulus of a detected power output of said amplifier relative to a modulus of an input power for said power amplifier.

20. Amplifying apparatus comprising control apparatus as claimed in claim 13, and said power amplifier operatively connected together.

21. Transmitter apparatus comprising the amplifying apparatus as claimed in claim 20, and at least one antenna to transmit a signal amplified by said power amplifier.

* * * * *